United States Patent
Lu

(10) Patent No.: US 12,181,991 B2
(45) Date of Patent: *Dec. 31, 2024

(54) MEMORY BLOCK AGE DETECTION

(71) Applicant: Taiwan Semiconductor Manufacturing Company Limited, Hsinchu (TW)

(72) Inventor: Shih-Lien Linus Lu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/338,680

(22) Filed: Jun. 21, 2023

(65) Prior Publication Data

US 2023/0333949 A1   Oct. 19, 2023

Related U.S. Application Data

(63) Continuation of application No. 17/715,421, filed on Apr. 7, 2022, now Pat. No. 11,720,458, and a
(Continued)

(51) Int. Cl.
*G06F 12/00* (2006.01)
*G06F 11/07* (2006.01)
(Continued)

(52) U.S. Cl.
CPC ........ *G06F 11/2284* (2013.01); *G06F 11/073* (2013.01); *G06F 11/076* (2013.01);
(Continued)

(58) Field of Classification Search
None
See application file for complete search history.

(56) References Cited

U.S. PATENT DOCUMENTS 10,147,499 B1   12/2018   Botea
11,720,458 B2 *  8/2023   Lu ................... G06F 11/076
                                                    711/103
(Continued)

FOREIGN PATENT DOCUMENTS

CN   101421792 A   4/2009
CN   106328208 A   1/2017
(Continued)

OTHER PUBLICATIONS

Office Action issued in connection with Chinese Appl. No. 202110199098.8 dated Jan. 2, 2024.
(Continued)

*Primary Examiner* — Daniel D Tsui
(74) *Attorney, Agent, or Firm* — FOLEY & LARDNER LLP

(57) ABSTRACT

Disclosed herein are related to an age detector for determining an age of a memory block, and a method of operation of the age detector. In one configuration, a memory system includes a memory block and an age detector coupled to the memory block. In one aspect, the memory block generates a first set of data in response to a first power on, and generates a second set of data in response to a second power on. In one configuration, the age detector includes a storage block to store the first set of data from the memory block, and inconsistency detector to compare the first set of data and the second set of data. In one configuration, the age detector includes a controller to determine an age of the memory block, based on the comparison.

20 Claims, 9 Drawing Sheets

Related U.S. Application Data continuation of application No. 16/900,691, filed on Jun. 12, 2020, now Pat. No. 11,301,343.

(51) Int. Cl.
  *G06F 11/22* (2006.01)
  *G06F 11/30* (2006.01)
  *G06F 12/02* (2006.01)
  *G11C 29/04* (2006.01)

(52) U.S. Cl.
  CPC ...... *G06F 11/3037* (2013.01); *G06F 12/0246* (2013.01); *G11C 2029/0407* (2013.01)

(56) References Cited

U.S. PATENT DOCUMENTS

| | | |
|---|---|---|
| 2004/0181716 A1 | 9/2004 | Stern et al. |
| 2006/0190778 A1 | 8/2006 | Loh |
| 2011/0199845 A1 | 8/2011 | Yang et al. |
| 2014/0068384 A1 | 3/2014 | Kwak et al. |
| 2015/0113354 A1 | 4/2015 | Wu et al. |
| 2020/0110660 A1 | 4/2020 | Cariello et al. |

FOREIGN PATENT DOCUMENTS

| | | |
|---|---|---|
| CN | 110036527 A | 7/2019 |
| JP | 2003-331596 A | 11/2003 |
| KR | 20150074655 A | 7/2015 |
| TW | 200809865 A | 2/2008 |
| TW | I428739 B | 3/2014 |
| TW | I431476 B | 3/2014 |

OTHER PUBLICATIONS

Akkaya, N.E.C., et al., "Secure Chip Odometers Using Intentional Controlled Aging", IEEE, International Symposium on Hardware Oriented Security and Trust (HOST), 2018, pp. 111-117.

Kim, T-H., et al., "Silicon Odometer: An On-Chip Reliability Monitor for Measuring Frequency Degradation of Digital Circuits", IEEE Journal of Solid-State Circuits, Apr. 2008, 43(4): 874-880.

Non-Final Office Action on U.S. Appl. No. 17/715,421 DTD Dec. 9, 2022.

Notice of Allowance on U.S. Appl. No. 17/715,421 DTD Mar. 22, 2023.

Taiwan Notice of Allowance for TW Appl. Ser. No. 110105979 dated Mar. 11, 2022 (4 pages).

US Notice of Allowance on U.S. Appl. No. 16/900,691 dated Dec. 14, 2021 (8 pages).

\* cited by examiner

MEMORY BLOCK AGE DETECTION

CROSS-REFERENCE TO RELATED APPLICATION

This application is a continuation of U.S. patent application Ser. No. 17/715,421, filed on Apr. 7, 2022, which is a continuation of U.S. patent application Ser. No. 16/900,691, filed on Jun. 12, 2020, which are incorporated herein by reference in their entireties.

BACKGROUND

Developments in electronic devices, such as computers, portable devices, smart phones, internet of thing (IoT) devices, etc., have prompted increased demands for memory devices. In general, memory devices may be volatile memory devices and non-volatile memory devices. Volatile memory devices can store data while power is provided, by but may lose the stored data once the power is shut off. Unlike volatile memory devices, non-volatile memory devices may retain data even after the power is shut off but may be slower than the volatile memory devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
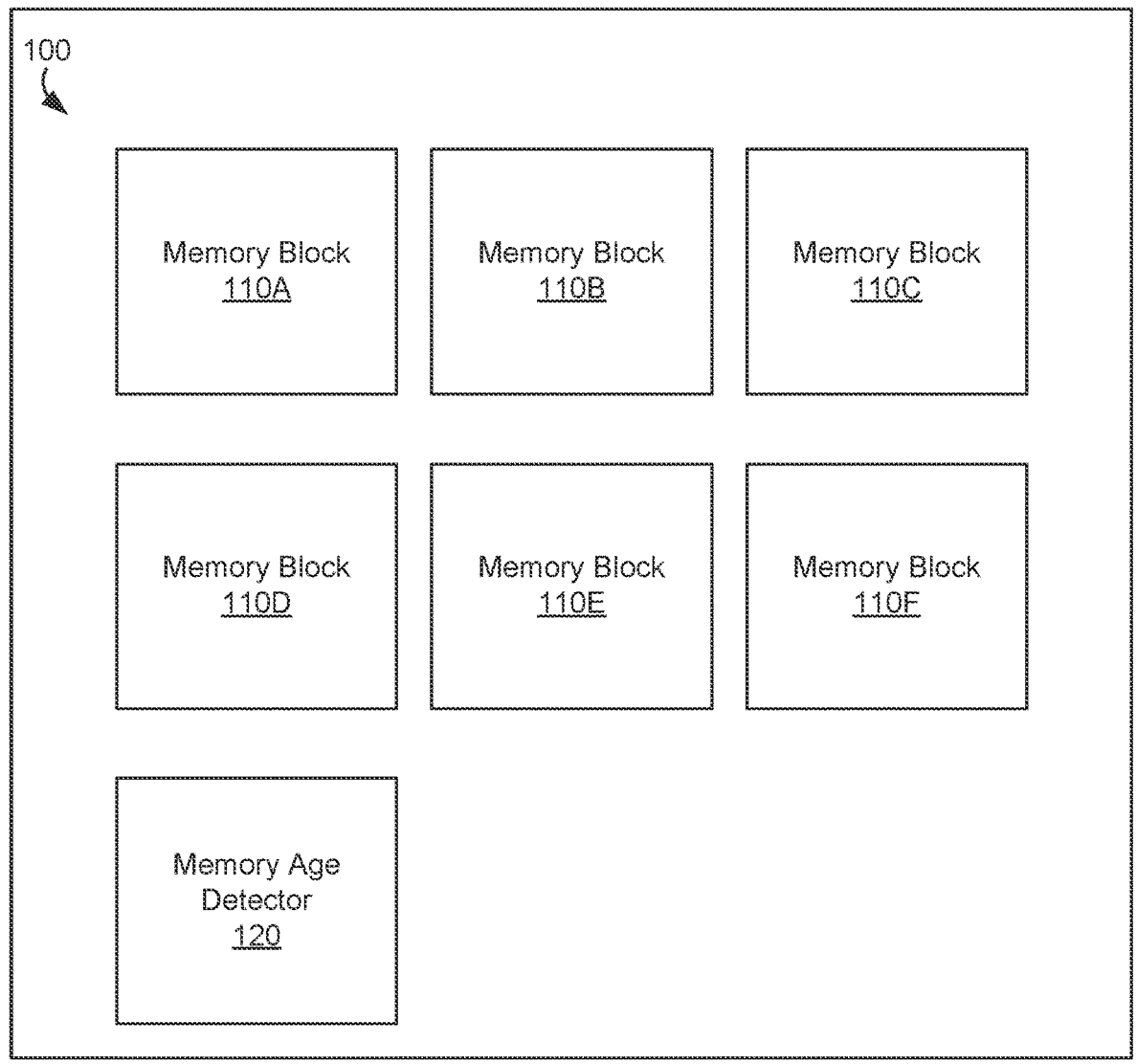
FIG. 1 is a diagram of a memory system including a plurality of memory blocks and a memory age detector, in accordance with one embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, a memory system includes a plurality of memory blocks and an age detector to determine an age of one or more of the plurality of memory blocks. In one aspect, the memory block generates a first set of data in response to a first power on and generates a second set of data in response to a second power on. In one configuration, the age detector includes a temporary storage block to store the first set of data from the memory block, and an inconsistency detector to compare the first set of data and the second set of data. In one configuration, the age detector includes a controller to determine an age of the memory block, based on the comparison.

In one aspect, the memory block includes a plurality of SRAM cells, where each memory cell may age or degrade through repeated read and write operations. For example, a SRAM cell may behave unstable or generate inconsistent data due to power on sequences. Such unstable operation of SRAM cells may cause errors in data stored, and further cause incorrect logic computations.

In one aspect, the age detector counts a number of bits that are generated inconsistently by a memory block in response to a power on. A consistent memory cell of the memory block may consistently generate a same bit, in response to multiple power on sequences, where an inconsistent memory cell of the memory block (or a memory cell aged or degraded through multiple operations) may generate different bits, in response to multiple power on sequences. In response to determining that the number of inconsistently generated bits exceeds a predetermined threshold number, the age detector may determine that the age of the memory block exceeded a predetermined usage. After determining that the memory block has exceeded the predetermined usage, such memory block may be precluded from further use, or a corrective operation can be performed on the memory block. Advantageously, an age of the memory block can be determined in a cost-efficient manner according to various embodiments disclosed herein.

FIG. 1 is a diagram of a memory system 100 including a plurality of memory blocks 110A . . . 110F and a memory age detector 120, in accordance with one embodiment. The memory blocks 110A . . . 110F may store data, and the memory age detector 120 may detect age or usage of the memory blocks 110A . . . 110F. In other embodiments, the memory device 100 includes more, fewer, or different components than shown in FIG. 1. For example, the memory system 100 includes more, fewer, or a different number of memory blocks 110 than shown in FIG. 1.

The memory block 110 is a hardware component that stores data. In one aspect, the memory block 110 is embodied as a semiconductor memory device. The memory block 110 includes a plurality of memory cells. In one aspect, each memory block 110 includes multiple SRAM cells.

In one aspect, the memory age detector 120 is a circuit or a hardware component that determines an age (or a number of usage) of the memory blocks 110. The memory age detector 120 may be coupled to one or more selected memory blocks of the memory blocks 110. The memory age detector 120 may be embodied as a logic circuit or a state machine in a field programmable gate array (FPGA) or an application specific integrated circuit (ASIC). In one aspect, the memory age detector 120 determines an inconsistency of a memory block 110 and determines an age (or a number of usage) of the memory block 110 according to the determined inconsistency. For example, the memory age detector 120 counts a number of bits that are generated inconsistently by the memory block 110 in response to a power on. In response to determining that the number of inconsistently generated bits exceeds a predetermined threshold number, the memory age detector 120 may determine that the age of the memory block 110 exceeded a predetermined usage. Example implementations and operations of the memory age detector 120 are provided below with respect to FIGS. 3 through 8.

Figure 2:
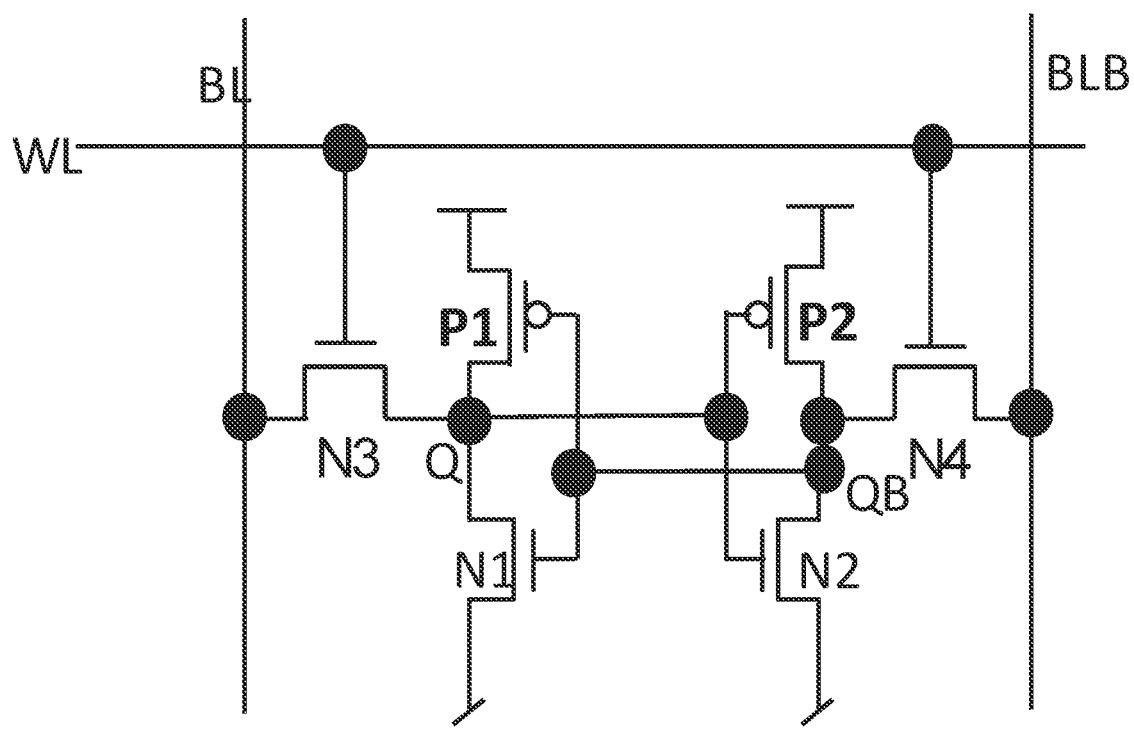
FIG. 2 is a diagram of a static random access memory (SRAM) cell, in accordance with one embodiment.

FIG. 2 is a diagram of a SRAM cell 200, in accordance with one embodiment. In some embodiments, each memory block 110 includes multiples of SRAM cells 200. In some embodiments, the SRAM cell 200 includes an N-type transistors N1, N2, N3, N4 and P-type transistors P1, P2. The N-type transistors N1, N2, N3, N4 may be N-type metal-oxide-semiconductor field-effect transistors (MOSFET) or N-type fin field-effect transistors (FinFET). The P-type transistors P1, P2 may be P-type MOSFET or P-type FinFET. These components may operate together to store a bit. In other embodiments, the SRAM cell 200 includes more, fewer, or different components than shown in FIG. 2.

In one configuration, the N-type transistors N3, N4 include gate electrodes coupled to a word line WL. In one configuration, a drain electrode of the N-type transistor N3 is coupled to a bit line BL, and a source electrode of the N-type transistor N3 is coupled to a port Q. In one configuration, a drain electrode of the N-type transistor N4 is coupled to a bit line BLB, and a source electrode of the N-type transistor N4 is coupled to a port QB. In one aspect, the N-type transistors N3, N4 operate as electrical switches. The N-type transistors N3, N4 may allow the bit line BL to electrically couple to or decouple from the port Q and allow the bit line BLB to electrically couple to or decouple from the port QB, according to a voltage applied to the word line WL. For example, according to a supply voltage VDD corresponding to a high state (or logic value '1') applied to the word line WL, the N-type transistor N3 is enabled to electrically couple the bit line BL to the port Q and the N-type transistor N4 is enabled to electrically couple the bit line BLB to the port QB. For another example, according to a ground voltage GND corresponding to a low state (or logic value '0') applied to the word line WL, the N-type transistor N3 is disabled to electrically decouple the bit line BL from the port Q and the N-type transistor N4 is disabled to electrically decouple the bit line BLB from the port QB.

In one configuration, the N-type transistor N1 includes a source electrode coupled to a first supply voltage rail supplying the ground voltage GND, a gate electrode coupled to the port QB, and a drain electrode coupled to the port Q. In one configuration, the P-type transistor P1 includes a source electrode coupled to a second supply voltage rail supplying the supply voltage VDD, a gate electrode coupled to the port QB, and a drain electrode coupled to the port Q. In one configuration, the N-type transistor N2 includes a source electrode coupled to the first supply voltage rail supplying the ground voltage GND, a gate electrode coupled to the port Q, and a drain electrode coupled to the port QB. In one configuration, the P-type transistor P2 includes a source electrode coupled to the second supply voltage rail supplying the supply voltage VDD, a gate electrode coupled to the port Q, and a drain electrode coupled to the port QB. In this configuration, the N-type transistor N1 and the P-type transistor P1 operate as an inverter, and the N-type transistor N2 and the P-type transistor P2 operate as an inverter, such that two inverters form cross-coupled inverters. In one aspect, the cross-coupled inverters may sense and amplify a difference in voltages at the ports Q, QB. When writing data, the cross-coupled inverters may sense voltages at the ports Q, QB provided through the N-type transistors N3, N4 and amplify a difference in voltages at the bit lines BL, BLB. For example, the cross-coupled inverters sense a voltage 0.5 V at the port Q and a voltage 0.4V at the port QB, and amplify a difference in the voltages at the ports Q, QB through a positive feedback (or a regenerative feedback) such that the voltage at the port Q becomes the supply voltage VDD (e.g., 1V) and the voltage at the port QB becomes the ground voltage GND VDD (e.g. 0V). The amplified voltages at the ports Q, QB may be provided to the bit lines BL, BLB through the N-type transistors N3, N4, respectively for reading.

In one aspect, the inverter formed by the P-type transistor P1 and the N-type transistor N1, and the inverter formed by the P-type transistor P2 and the N-type transistor N2 are designed in a symmetric manner. However, a mismatch may exist between two inverters due to a fabrication process. Such mismatch allows the SRAM cell 200 to generate voltages at the ports Q, QB, in response to a power on. For example, when the SRAM cell 200 is powered off, voltages at the ports Q, QB may be reset to the same voltage (e.g., ground voltage). When the SRAM cell 200 is powered on, voltages at the ports Q, QB may rise to a half of the supply voltage VDD. Due to a mismatch between the two inverters, voltages at the ports Q, QB can be different by a small amount (e.g., 0.01V). Through the positive feedback, the cross-coupled inverters can further diverge the voltages at the ports Q, QB. Assuming for an example that the P-type transistor P1 is slightly stronger than the P-type transistor P2, the voltage at the port Q (e.g., 0.51V) may become higher than the voltage at the port QB (e.g., 0.49V). Through the positive feedback, the voltage difference can increase such that the voltage at the port Q becomes the supply voltage VDD representing high state (or logic value '1') and the voltage at the port QB becomes the ground voltage GND representing low state (or logic value '0'). Hence, due to such asymmetry in the inverters, the SRAM cell 200 can generate a bit represented by voltages at the ports Q, QB according to power on. In one aspect, a consistent SRAM cell 200 that has not aged over a predetermined number of usages can generate voltages or bits at the ports Q, QB in a consistent manner, in response to multiple power on sequences.

In one aspect, multiple usage of the SRAM cell 200 can deteriorate or weaken an inverter or a transistor of the SRAM cell 200 to cause the SRAM cell 200 to be inconsistent. For example, the ground voltage GND can be more frequently applied to the gate electrode of the P-type transistor P1 than the gate electrode of the P-type transistor P2, where the supply voltage VDD can be more frequently applied to the gate electrode of the P-type transistor P2 than the gate electrode of the P-type transistor P1. Hence, more stress can be applied to the P-type transistor P1 than the transistor P2 through repeated usage of the SRAM cell 200, such that the P-type transistor P1 can become weaker than the P-type transistor P2. When the P-type transistor P1 becomes weaker than the P-type transistor P2, voltages at the ports Q, QB may be generated in an inconsistent manner in response to power on. Moreover, the weakened transistor may cause errors in data stored by the SRAM cell 200 and cause incorrect logic computations. As the memory block 110 ages through multiples usages of the memory block 110, a number of inconsistent memory cells generating inconsistent bits due to power on sequence may increase.

Figure 3:
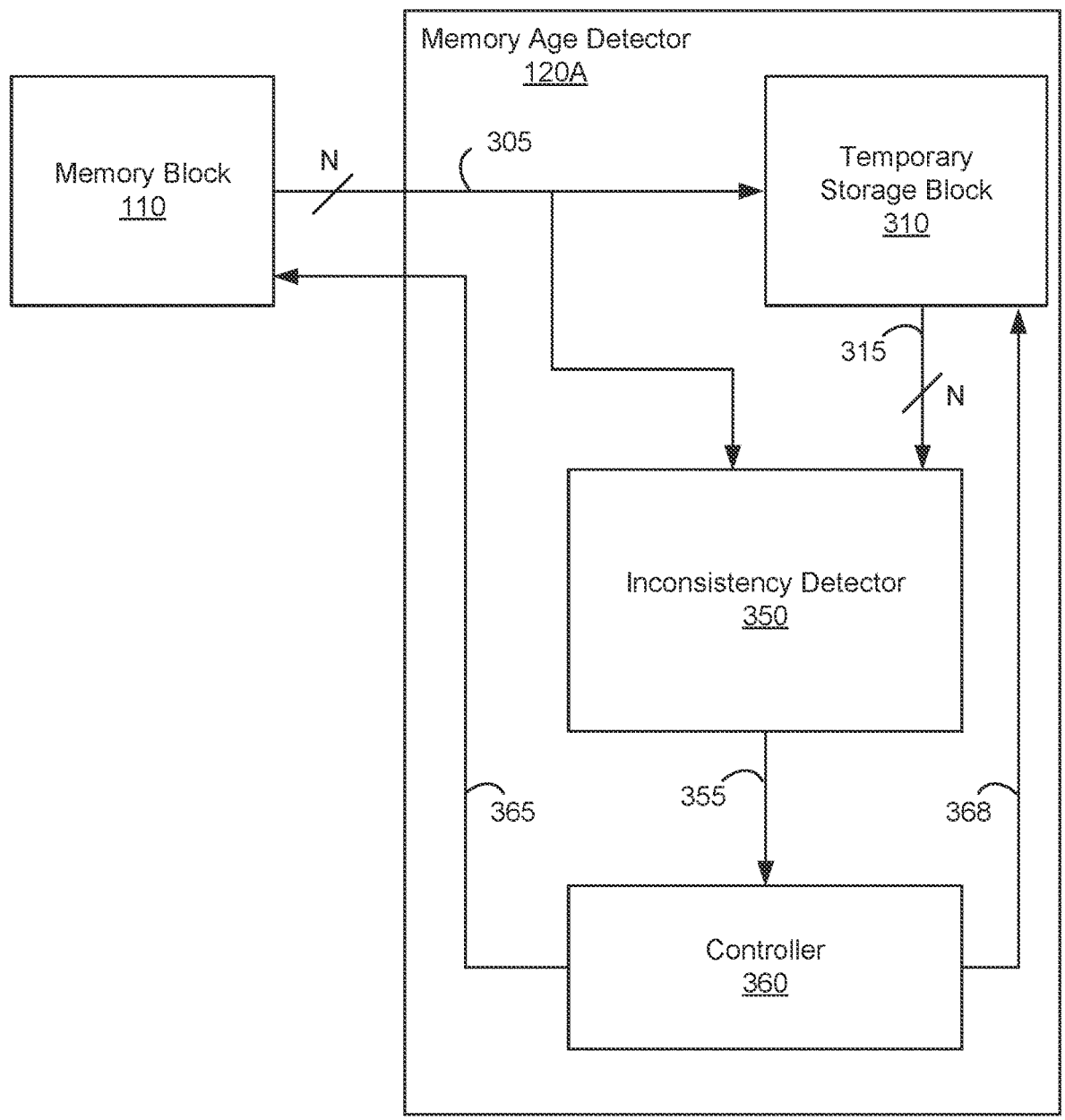
FIG. 3 is a diagram of a memory age detector detecting an age of a memory block, in accordance with one embodiment.

FIG. 3 is a diagram of the memory age detector 120A detecting an age of a memory block 110, in accordance with one embodiment. In some embodiments, the memory age detector 120A includes a temporary storage block 310, an inconsistency detector 350, and a controller 360. These components may operate together to detect an age or a number of usages of the memory block 110. In one aspect, the memory age detector 120A detects or determines inconsistencies in data generated by the memory block 110 during a power on sequence. In some embodiments, the memory age detector 120A includes more, fewer, or different components than shown in FIG. 3.

In some embodiments, the temporary storage block 310 is a circuit or a component that stores N-bit data 305 from bit lines of the memory block 110. In some embodiments, the temporary storage block 310 can be replaced by a different circuit or a different component having the same functionalities of the temporary storage block 310 described herein. The temporary storage block 310 may be coupled to bit lines of the memory block 110 through conductive materials (e.g., electrical traces). The temporary storage block 310 may have the same size as the memory block 110. The temporary storage block 310 and the memory block 110 may be embodied as the same type of memory cells. For example, the memory block 110 includes N number of SRAM cells 200, and the temporary storage block 310 includes N number of SRAM cells 200. In some implementation, the temporary storage block 310 and the memory block 110 include different types of memory cells. For example, the memory block 110 includes N number of SRAM cells 200, and the temporary storage block 310 includes N number of non-volatile memory cells. In one aspect, the temporary storage block 310 functions or operates as a temporary storage to store N-bit data 305 stored or generated by the memory block 110.

In some embodiments, the inconsistency detector 350 is a circuit or a component that compares N-bit data 305 from the memory block 110 and N-bit data 315 from the temporary storage block 310, and detects a number of inconsistent memory cells of the memory block 110 based on the N-bit data 305 and the N-bit data 315. In some embodiments, the inconsistency detector 350 can be replaced by a different circuit or a different component having the same functionalities of the inconsistency detector 350 described herein. The inconsistency detector 350 may be coupled to the memory block 110 and the temporary storage block 310 through conductive materials (e.g., electrical traces). In this configuration, the inconsistency detector 350 compares each bit of the N-bit data 305 with a corresponding bit of the N-bit data 315, and generates an inconsistency count 355 indicating a number of inconsistent memory cells of the memory block 110. In one approach, the inconsistency count 355 is generated or determined based on a difference between the N-bit data 305 from the memory block 110 and the N-bit data 315 from the temporary storage block 310. For example, if N-bit data 305 has [0 0 0 0], and N-bit data 315 has [0 1 1 0], the inconsistency detector 350 may generate the inconsistency count 355 having a value two corresponding to a number of different bits. The inconsistency detector 350 may provide the inconsistency count 355 to the controller 360. Example implementations and operations of the inconsistency detector 350 are provided below with respect to FIG. 4.

In some embodiments, the controller 360 is a circuit or a component that configures the memory block 110 and the temporary storage block 310 to detect inconsistencies in N-bit data 305 from the memory block 110 and N-bit data 315 from the temporary storage block 310, and receives the inconsistency count 355 from the inconsistency detector 350. In some embodiments, the controller 360 can be replaced by a different circuit or a different component having the same functionalities of the controller 360 described herein. The controller 360 may be coupled to the memory block 110, the temporary storage block 310, and the inconsistency detector 350 through conductive materials (e.g., electrical traces). In one aspect, the controller 360 generates a control signal 365 to power on or power off the memory block 110. In one aspect, the controller 360 generates a control signal 368 to receive and store input data (e.g., N-bit data 305).

In one approach, the controller 360 provides the control signal 365 to the memory block 110 to power on the memory block 110. In response to the control signal 365, the memory block 110 may power on and generate N-bit data 305. After powering on the memory block 110, the controller 360 may provide the control signal 368 to the temporary storage block 310 to cause the temporary storage block 310 to receive the N-bit data 305 from the memory block 110 and to store the N-bit data 305. After storing the N-bit data 305 by the temporary storage block 310, the controller 360 may provide the control signal 365 to the memory block 110 to power off or reset the memory block 110. After powering off or resetting the memory block 110, the controller 360 may provide the control signal 365 to the memory block 110 to power on the memory block 110. In response to the control signal 365, the memory block 110 may power on and generate updated N-bit data 305. In one approach, the inconsistency detector 350 may compare the updated N-bit data 305 from the memory block 110 and the N-bit data 315 stored by the temporary storage block 310, and generate the inconsistency count 355 indicating the number of inconsistent memory cells. The controller 360 may receive the inconsistency count 355, and compare the inconsistency count 355 with a predetermined threshold number corresponding to a predetermined age or a predetermined usage (e.g., over one million power on sequences) of the memory block 110. In response to determining that the inconsistency count 355 is larger than the predetermined threshold number, the controller 360 may determine that the memory block 110 has aged or has been used over a predetermined number. In response to determining that the inconsistency count 355 is less than the predetermined threshold number, the controller 360 may determine that the memory block 110 has not aged or has not been used over the predetermined number. The controller 360 may repeat the process to further test or detect age or inconsistency of the memory block 110.

Advantageously, the memory age detector 120A can determine an age or a number of usages of the memory block 110 in a cost-efficient manner. In one aspect, without employing expensive tools or machines for examining characteristics of memory cells of the memory block 110, the memory age detector 120A may determine whether, in response to two or more power on sequences, the memory block 110 generates the N-bit data 305 in a consistent manner. Moreover, based on the determination on the consistency of the memory block 110, the memory age detector 120A may detect or determine an age or a number of usages of the memory block 110 in a cost-efficient manner.

Figure 4:
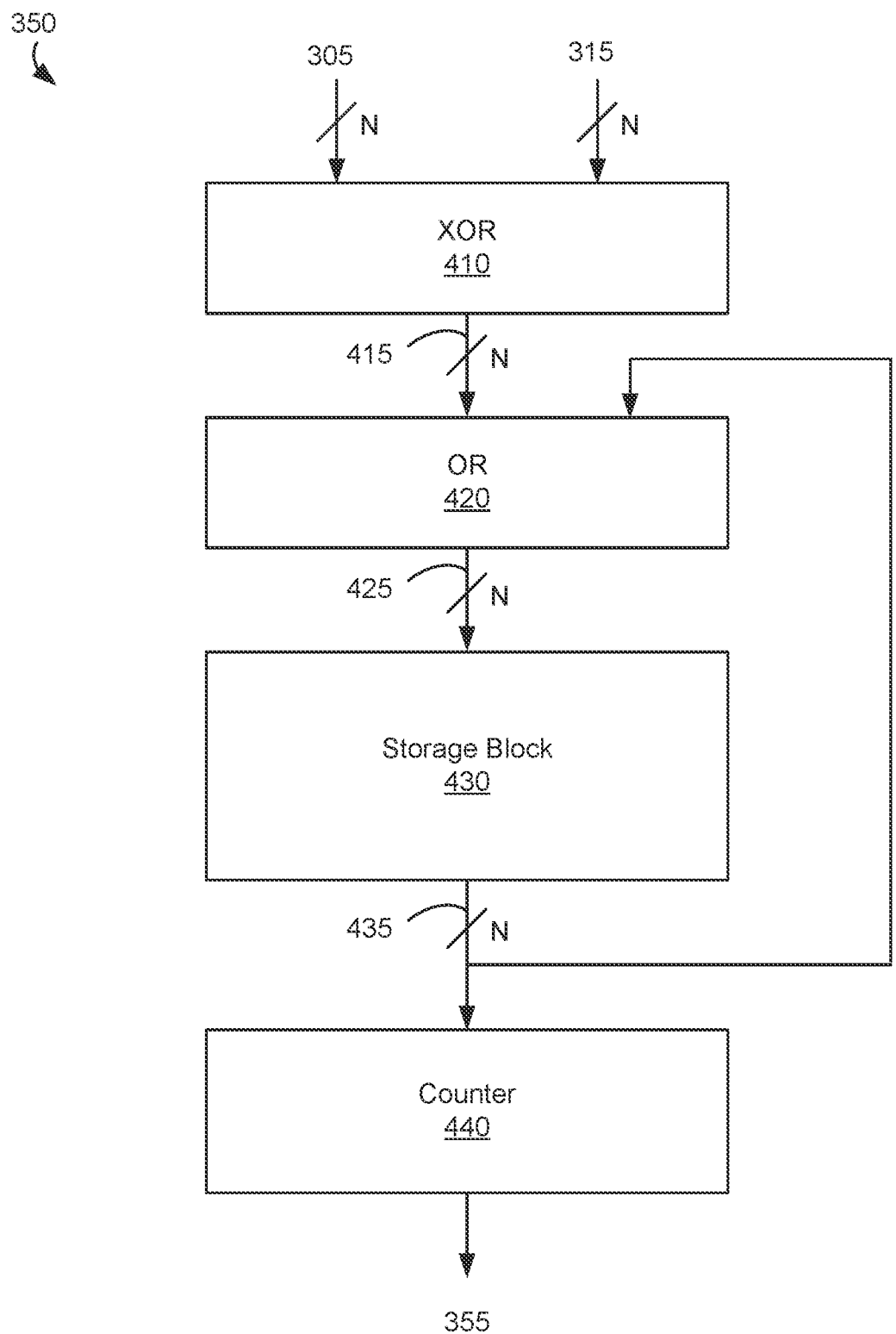
FIG. 4 is a diagram of an inconsistency detector, in accordance with one embodiment.

FIG. 4 is a diagram of the inconsistency detector 350, in accordance with one embodiment. In some embodiments, the inconsistency detector 350 includes an N-bit XOR gate 410, an N-bit OR gate 420, a storage block 430, and a counter 440. These components may operate together to determine a number of inconsistent memory cells of the memory block 110, and generate the inconsistency count 355 indicating the determined number of inconsistent memory cells. In some embodiments, the inconsistency detector 350 includes more, fewer, or different components than shown in FIG. 4.

In some embodiments, the N-bit XOR gate 410 is a circuit or a component that performs XOR operation on the N-bit data 305 and the N-bit data 315. In some embodiments, the N-bit XOR gate 410 can be replaced by a different circuit or a different component having the same functionalities of the N-bit XOR gate 410 described herein. The N-bit XOR gate 410 may be coupled to the memory block 110, the temporary storage block 310, and the OR gate 420 through conductive materials (e.g., electrical traces). In this configuration, the N-bit XOR gate 410 may compare each bit of the N-bit data 305 with a corresponding bit of the N-bit data 315 and generate N-bit XOR outputs 415 indicating the comparison. For example, if a state of a bit of the N-bit data 305 is different than a state of the corresponding bit of the N-bit data 315, an XOR gate may generate an output bit having a high state (or logic value '1') indicating the difference. For example, if a state of a bit of the N-bit data 305 is same as a state of the corresponding bit of the N-bit data 315, an XOR gate may generate a bit having a low state (or logic value '0') indicating no difference. In one example, if the N-bit data 305 has [0 0 1 1] and the N-bit data 315 has [0 1 1 0], the XOR gate 410 may generate the N-bit XOR output 415 having [0 1 0 1] indicating that second and fourth bits of the N-bit data 305 are different from the second and fourth bits of the N-bit data 315.

In some embodiments, the N-bit OR gate 420 is a circuit or a component that performs N-bit OR operation on the N-bit data 305 with the N-bit data 315. In some embodiments, the N-bit OR gate 420 can be replaced by a different circuit or a different component having the same functionalities of the N-bit OR gate 420 described herein. The N-bit OR gate 420 may have first inputs coupled to outputs of the N-bit XOR gate 410, second inputs coupled to outputs of the storage block 430, and outputs coupled to inputs of the storage block 430 through conductive materials (e.g., electrical traces). In this configuration, the N-bit OR gate 420 may compare each bit of the N-bit XOR output 415 with a corresponding bit of N-bit storage output 435 from the storage block 430, and generate N-bit OR outputs 425 indicating the result of the OR operation. For example, if any of a bit of the XOR output 415 and a corresponding bit of the N-bit storage output 435 has a high state (or logic value '1'), an OR gate may generate a bit having a high state (or logic value '1') indicating at least one inconsistency or difference detected in a memory cell associated with the bit of the N-bit data 305. For example, if both the XOR output 415 and a corresponding bit of the N-bit storage output 435 have a low state (or logic value '0'), an OR gate may generate a bit having a low state (or logic value '0') indicating no inconsistency or difference detected in a memory cell associated with the bit of the N-bit data 305. In one example, if the N-bit XOR output 415 has [0 1 0 1] and the N-bit storage output 435 has [0 0 1 1], the OR gate 420 may generate the N-bit OR output 425 having [0 1 1 1] indicating that memory cells of the memory block 110 associated with the second, third, fourth bits of the N-bit data 305 have inconsistency.

In some embodiments, the storage block 430 is a circuit or a component that receives and stores the N-bit OR output 425, and outputs the stored data as the N-bit storage output 435. In some embodiments, the storage block 430 can be replaced by a different circuit or a different component having the same functionalities of the storage block 430 described herein. The storage block 430 may be coupled to the N-bit OR gate 420 and the counter 440 through conductive materials (e.g., electrical traces). The storage block 430 and the temporary storage block 310 may be embodied as the same type of memory cells or different types of memory cells. The storage block 430 may have the same size as the memory block 110. In one aspect, each memory cell of the storage block 430 stores a bit indicating whether any inconsistency is detected in a memory cell of the memory block 110 associated with the bit. For example, a third memory cell of the storage block 430 may store a bit having a high state (or logic value '1') indicating that an inconsistency of the corresponding third memory cell of the memory block 110 is detected. The storage block 430 may provide the N-bit storage output 435 to the N-bit OR gate 420 and the counter 440.

In some embodiments, the counter 440 is a component that receives the N-bit storage output 435 from the storage block 430 and counts a number of high states (or logic value '1') in the N-bit storage output 435. In some embodiments, the counter 440 can be replaced by a different circuit or a different component having the same functionalities of the counter 440 described herein. The counter 440 may be coupled to the N-bit storage block 430, and the controller 360 through conductive materials (e.g., electrical traces). In this configuration, the counter 440 may count a number of high states (or logic value '1') in the N-bit storage output 435, and generate the inconsistency count 355 indicating the counted number. For example, if the N-bit storage output 435 has [0 1 1 1], the counter may generate the inconsistency count 355 having a value three. The counter 440 may provide the inconsistency count 355 to the controller 360.

Advantageously, the inconsistency detector 350 can accumulate or store any inconsistency detected in the N-bit data 305 from the memory block 110 through multiple power on sequences, and generate the inconsistency count 355 by implementing inexpensive logic components such as N-bit XOR gate 410, N-bit OR gate 420, and the counter 440. Hence, the inconsistency detector 350 can be implemented in a cost-efficient manner.

Figure 5:
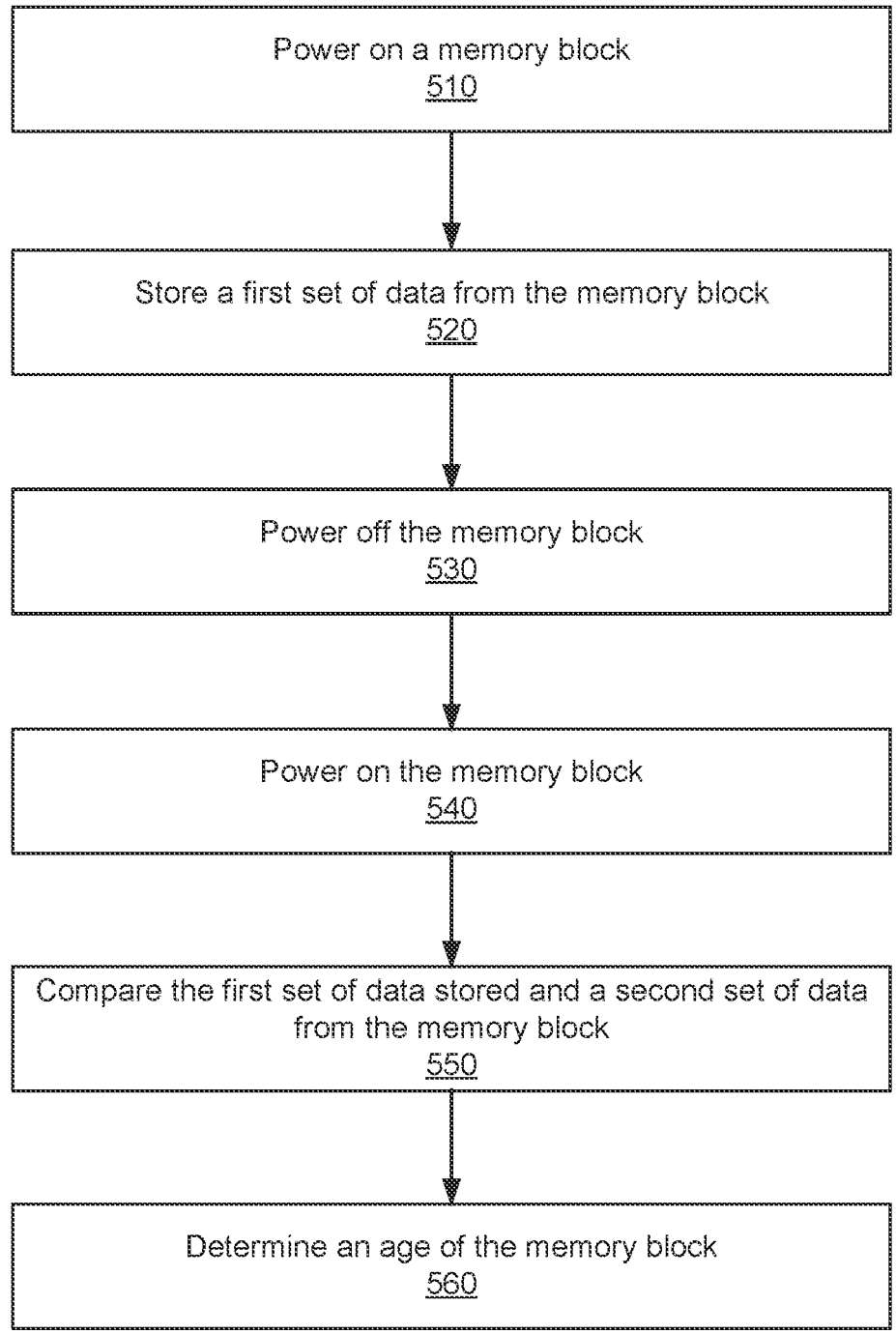
FIG. 5 is a flowchart of a method of determining an age of a memory block, in accordance with some embodiments.

FIG. 5 is a flowchart of a method of 500 determining an age of a memory block 110, in accordance with some embodiments. The method 500 may be performed by one or more components of the memory age detector 120A of FIG. 3. In some embodiments, the method 500 is performed by other entities. In one aspect, the method 500 is performed periodically (e.g., every 1000 power on) or in response to a request from another device. In some embodiments, the method 500 includes more, fewer, or different operations than shown in FIG. 5.

In an operation 510, the controller 360 causes the memory block 110 to power on at a first time. When the memory block 110 is powering on, no input data may be provided to the memory block 110. When powering on, the memory block 110 may generate a first set of data (e.g., N-bit data 305). In an operation 520, after powering on the memory block 110, the memory block 110 may provide the first set of data (e.g., N-bit data 305) to the temporary storage block 310, and the temporary storage block 310 may store the received first set of data (e.g., N-bit data 305). In an operation 530, after storing the first set of data (e.g., N-bit data 305) by the temporary storage block 310, the controller 360 may cause the memory block 110 to power off or reset.

In an operation 540, after powering off the memory block 110, the controller 360 causes the memory block 110 to power on at a second time after the first time. When the memory block 110 is powering on, no input data may be provided to the memory block 110. When powering on, the memory block 110 may generate a second set of data (e.g., updated N-bit data 305).

In an operation 550, the inconsistency detector 350 compares the first set of data (e.g., N-bit data 315) stored by the temporary storage block 310 with the second set of data (e.g., updated N-bit data 305) generated by the memory block 110, and generates an inconsistency count 355 indicating a number of inconsistent memory cells of the memory block 110 based on the comparison. In one approach, the inconsistency detector 350 compares each bit of the first set of data (e.g., old N-bit data 305) with a corresponding bit of the second set of data (e.g., updated N-bit data 315), and determines different bits or inconsistent bits according to the comparison. Moreover, the inconsistency detector 350 may generate the inconsistency count 355 indicating a number of inconsistent cells corresponding to the inconsistent bits.

In an operation 560, the controller 360 determines an age of the memory block 110 according to the comparison. In one approach, the controller 360 compares the inconsistency count 355 with a predetermined threshold number corresponding to a predetermined age or a predetermined usage (e.g., over one million power on sequences) of the memory block 110. In response to determining that the inconsistency count 355 is larger than the predetermined threshold number, the controller 360 may determine that the memory block 110 has aged or has been used over a predetermined number. In response to determining that the inconsistency count 355 is less than the predetermined threshold number, the controller 360 may determine that memory block 110 has not aged or has not been used over the predetermined number. Advantageously, an age of the memory block 110 can be determined in a cost-efficient manner with inexpensive or cost efficient logic circuits.

Figure 6:
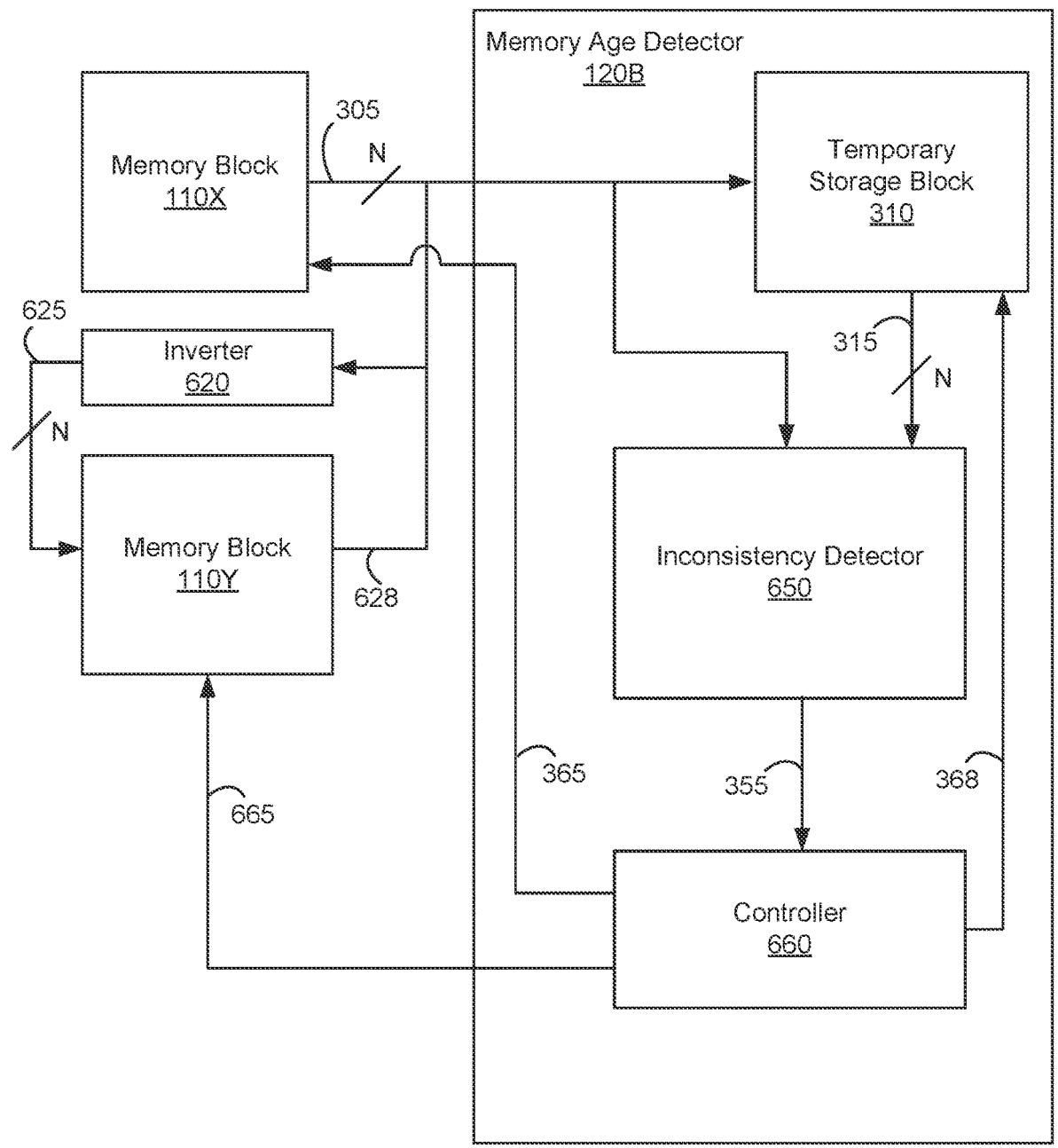
FIG. 6 is a diagram of a memory age detector detecting an age of a memory block, in accordance with one embodiment.

FIG. 6 is a diagram of a memory age detector 120B detecting an age of a memory block 110X, in accordance with one embodiment. In some embodiments, the memory age detector 120B includes the temporary storage block 310, an inconsistency detector 650, and a controller 660. These components may operate together to detect an age or a number of usages of the memory block 110X. In addition, the memory system 100 includes an inverter 620 and a memory block 110Y that operate together to perform anti-aging on the memory block 110X. In some embodiments, the memory age detector 120B includes more, fewer, or different components than shown in FIG. 6.

In some embodiments, the inverter 620 is a circuit or a component that inverts states of the N-bit data 305 from the memory block 110X. In one configuration, the inverter 620 is coupled to bit lines of the memory block 110X through conductive materials (e.g., electrical traces). In this configuration, the inverter 620 may receive the N-bit data 305 from the bit lines of the memory block 110X and generate inverted N-bit data 625 having inverted states of the N-bit data 305. The inverter 620 may provide the inverted N-bit data 625 to the memory block 110Y.

In some embodiments, the memory block 110Y is a circuit or a component that receives the inverted N-bit data 625 from the inverter 620 and stores the inverted N-bit data 625. The memory block 110Y may include memory cells with bit lines coupled to the outputs of the inverter 620 and coupled to bit lines of the memory block 110X through conductive materials (e.g., electrical traces). The memory block 110Y and the memory block 110X may have the same size. The memory block 110Y and the memory block 110X may be embodied as the same type of memory cells. For example, the memory block 110X includes N number of SRAM cells 200, and the memory block 110Y includes N number of SRAM cells 200. In one aspect, the memory block 110Y functions or operates as a storage to store the inverted N-bit data 625.

In one aspect, the inverter 620 and the memory block 110Y function or operate to apply anti-aging to the memory block 110X. As described with respect to FIG. 2, SRAM cell 200 includes transistors (e.g., P-type transistors P1, P2, N-type transistors N1, N2), where one transistor may be more exposed to a ground voltage GND where another voltage may be more exposed to a supply voltage VDD due to a mismatch in the transistors. Because the transistors are exposed to different voltages in an unbalanced manner due to mismatch, one transistor may degrade or age more quickly than the other transistor. In one aspect, the memory block 110Y stores the inverted N-bit data 625 having inverted states of the N-bit data 305, and apply the inverted N-bit data 625 to bit lines of the memory block 110X. By applying the stored inverted N-bit data 628 to bit lines of the memory block 110X, transistors of the SRAM cells 200 in the memory block 110X can be exposed to different voltages (e.g., VDD or GND) in a balanced manner. Accordingly, aging or degrading of the memory bock 110X can be mitigated.

In some embodiments, the inconsistency detector 650 is implemented and operates in a similar manner to the inconsistency detector 350 of FIG. 3, except that the inconsistency detector 650 detects a number of inconsistent memory cells of the memory block 110X based on the N-bit data 305 from the memory block 305 and the inverted N-bit data 628 from the memory block 110Y. In one approach, the inconsistency detector 650 determines a first number of inconsistent bits or different bits in the N-bit data 305, and determines a second number of inconsistent bits or different bits in the inverted N-bit data 628. The inconsistency detector 650 may determine the inconsistency count 355 indicating a number of inconsistent memory cells of the memory block 110X according to a difference between the first number and the second number. The inconsistency detector 350 may provide the inconsistency count 355 to the controller 660. Example implementations and operations of the inconsistency detector 650 are provided below with respect to FIG. 7.

In some embodiments, the controller 660 is implemented and operates in a similar manner to the controller 360 except that the controller 660 also provides a control signal 665 to configure or control the memory block 110Y. In one approach, the controller 660 may generate the control signals 365, 368, 665 to determine a first number of inconsistent bits or different bits in the N-bit data 305. In one approach, the controller 660 provides the control signal 365 to the memory block 110X to power on the memory block 110X. In response to the control signal 365, the memory block 110X may power on and generate N-bit data 305. After powering on the memory block 110X, the controller 660 may provide the control signal 368 to the temporary storage block 310 to cause the temporary storage block 310 to receive the N-bit data 305 from the memory block 110X and store the N-bit data 305. In one aspect, the inverter 620 may generate the inverted N-bit data 625 by inverting the states of the N-bit data 305. The controller 660 may provide the control signal 665 to the memory block 110Y to cause the memory block 110Y to receive and store the inverted N-bit data 625. After storing the N-bit data 305 by the temporary storage block 310 and the inverted N-bit data 625 by the memory block 110Y, the controller 660 may provide the control signal 365 to the memory block 110X to power off or reset the memory block 110X. After powering off or resetting the memory block 110X, the controller 660 may provide the control signal 365 to the memory block 110X to power on the memory block 110X. In response to the control signal 365, the memory block 110X may power on and generate updated N-bit data 305. In one approach, the inconsistency detector 650 may compare the updated N-bit data 305 from the memory block 110X and the N-bit data 315 from the temporary storage block 310 and determine the first number of inconsistent bits in the N-bit data 305.

After determining the first number of inconsistent bits, the controller 660 may generate the control signals 365, 368, 665 to determine a second number of inconsistent bits or different bits in the inverted N-bit data 628. In one approach, after determining the first number of inconsistent bits in the N-bit data 305, the controller 660 may provide the control signal 665 to the memory block 110Y to cause the memory block 110Y to output the inverted N-bit data 628, and provide the control signal 368 to the temporary storage block 310 to cause the temporary storage block 310 to receive and store the inverted N-bit data 628 from the memory block 110Y. After storing the inverted N-bit data 628 by the temporary storage block 310, the inverter 620 may generate the updated inverted N-bit data 625 by inverting the states of the updated N-bit data 305. The controller 660 may provide the control signal 665 to cause the memory block 110Y to store the updated inverted N-bit data 625 from the inverter 620. In one approach, the inconsistency detector 650 may compare the updated inverted N-bit data 628 from the memory block 110Y and the N-bit data 315 stored by the temporary storage block 310 corresponding to the inverted N-bit data 628, and determine the second number of inconsistent bits of the inverted N-bit data 628.

According to the first number of inconsistent bits of the N-bit data 305 and the second number of inconsistent bits of the inverted N-bit data 628, the inconsistency detector 650 may generate the inconsistency count 355 indicating a number of inconsistent memory cells of the memory block 110X. For example, the inconsistency detector 650 may determine or generate the inconsistency count 355 corresponding to the difference between the first number and the second number.

The controller 660 may receive the inconsistency count 355, and compare the inconsistency count 355 with a predetermined threshold number corresponding to a predetermined age or a predetermined usage (e.g., over one million power on sequences) of the memory block 110X. In response to determining that the inconsistency count 355 is larger than the predetermined threshold number, the controller 660 may determine that the memory block 110X has aged or has been used over a predetermined number. In response to determining that the inconsistency count 355 is less than the predetermined threshold number, the controller 660 may determine that the memory block 110X has not aged or has not been used over the predetermined number. The controller 660 may repeat the process to further test or detect age or consistency of the memory block 110X.

Advantageously, the memory age detector 120B can determine an age or a number of usages of the memory block 110X based on the memory block 110Y to improve detecting unstable memory cells. In one aspect, the inverter 620 and the memory block 110Y operate to perform anti-aging on the memory block 110X. By determining a difference between i) a first number of inconsistent bits or different bits in the N-bit data 305, and ii) a second number of inconsistent bits or different bits in the inverted N-bit data 628, a memory cell of the memory block 110X that produced a consistent or a stable bit despite aging can be detected as well.

Figure 7:
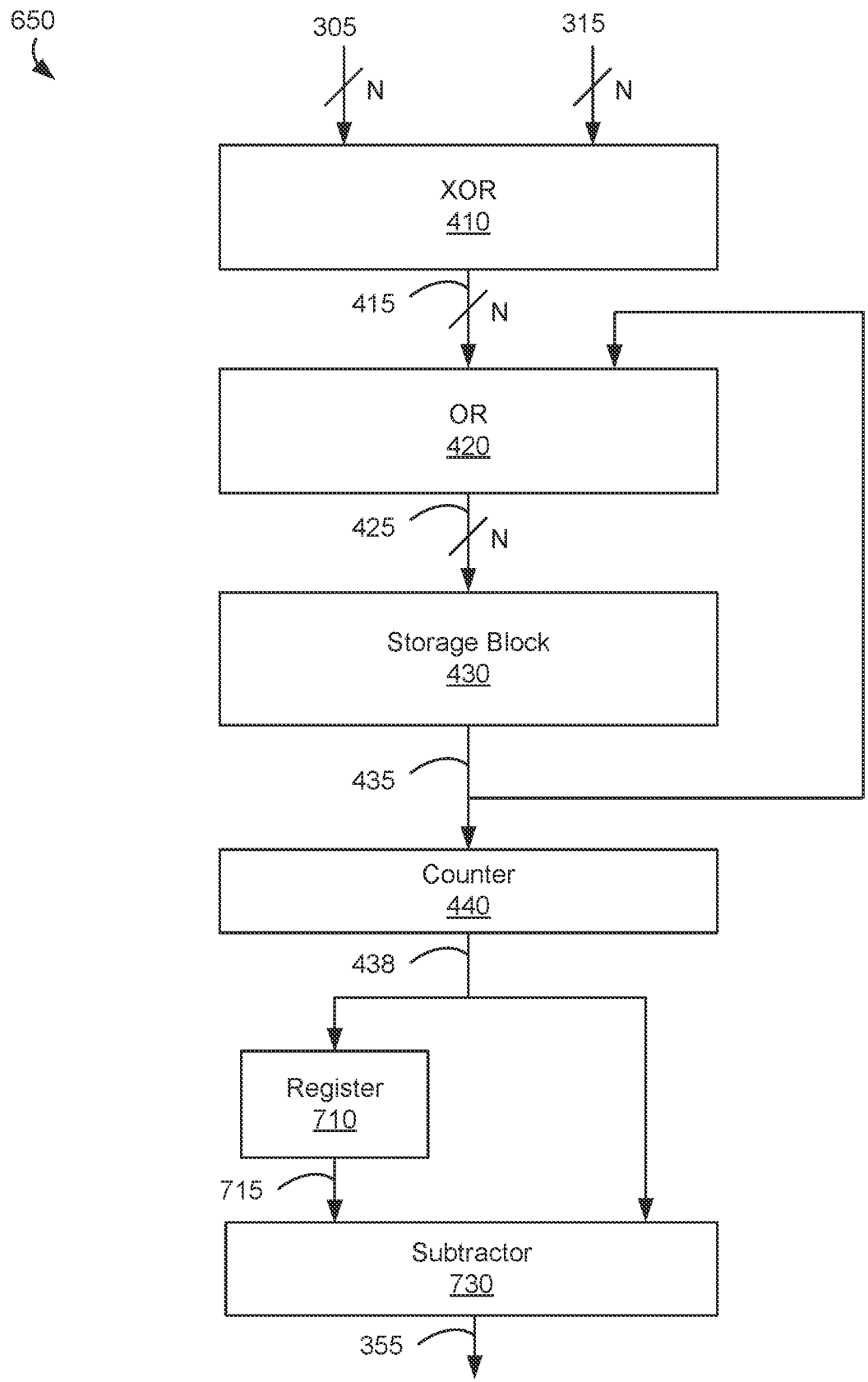
FIG. 7 is a diagram of an inconsistency detector, in accordance with one embodiment.

FIG. 7 is a diagram of the inconsistency detector 650, in accordance with one embodiment. In one aspect, the inconsistency detector 650 is similar to the inconsistency detector 350 of FIG. 4, except the inconsistency detector 650 includes a register 710 and a subtractor 730. Thus, detailed description of duplicated portion thereof is omitted herein for the sake of brevity.

In one approach, the N-bit XOR gate 410, the N-bit OR gate 420, the storage block 430, and the counter 440 can operate according to i) the N-bit data 315 from the temporary storage block 310 corresponding to the N-bit data 305 and ii) the updated N-bit data 305 from the memory block 110X, in a similar manner described above with respect to FIG. 4 to generate a first counted number 438. Then, the N-bit XOR gate 410, the N-bit OR gate 420, the storage block 430, and the counter 440 can operate according to i) the N-bit data 315 from the temporary storage block 310 corresponding to the inverted N-bit data 628 and ii) the updated inverted N-bit data 628 from the memory block 110Y, in a similar manner described above with respect to FIG. 4 to generate a second counted number 438.

In some embodiments, the register 710 is a circuit or a component that stores the first counted number 438 from the counter 440. In some embodiments, the register 710 can be replaced by a different circuit or a different component having the same functionalities of the register 710 described herein. The register 710 may have an input coupled to an output of the counter 440 and an output coupled to an input of the subtractor 730. In this configuration, the register 710 can receive the first counted number 438 from the counter 440 and store the first counted number 438. Moreover, the register 710 may provide the stored number 715 to the subtractor 730.

In some embodiments, the subtractor 730 is a circuit or a component that subtracts the stored number 715 and the second counted number 438 from the counter 440 to generate the inconsistency count 355. In some embodiments, the subtractor 730 can be replaced by a different circuit or a different component having the same functionalities of the subtractor 730 described herein. In one aspect, the subtractor 730 can determine a difference between the stored number 715 (or the first counted number) and the second counted number 438, and generate the inconsistency count 355 indicating a number of inconsistent memory cells of the memory block 110X according to the determined difference. The subtractor 730 may output to the controller 660 the inconsistency count 355, based on which the age or a number of usages of the memory block 110X can be determined.

Advantageously, the memory age detector 120B can determine an age or a number of usages of the memory block 110X based on the memory block 110Y to improve detecting unstable memory cells. In one aspect, the inverter 620 and the memory block 110Y operate to perform anti-aging on the memory block 110X. By determining a difference between i) a first number 715 of inconsistent bits or different bits in the N-bit data 305, and ii) a second number 438 of inconsistent bits or different bits in the inverted N-bit data 628, a memory cell of the memory block 110X that produced a consistent or a stable bit despite aging can be detected as well.

Figure 8:
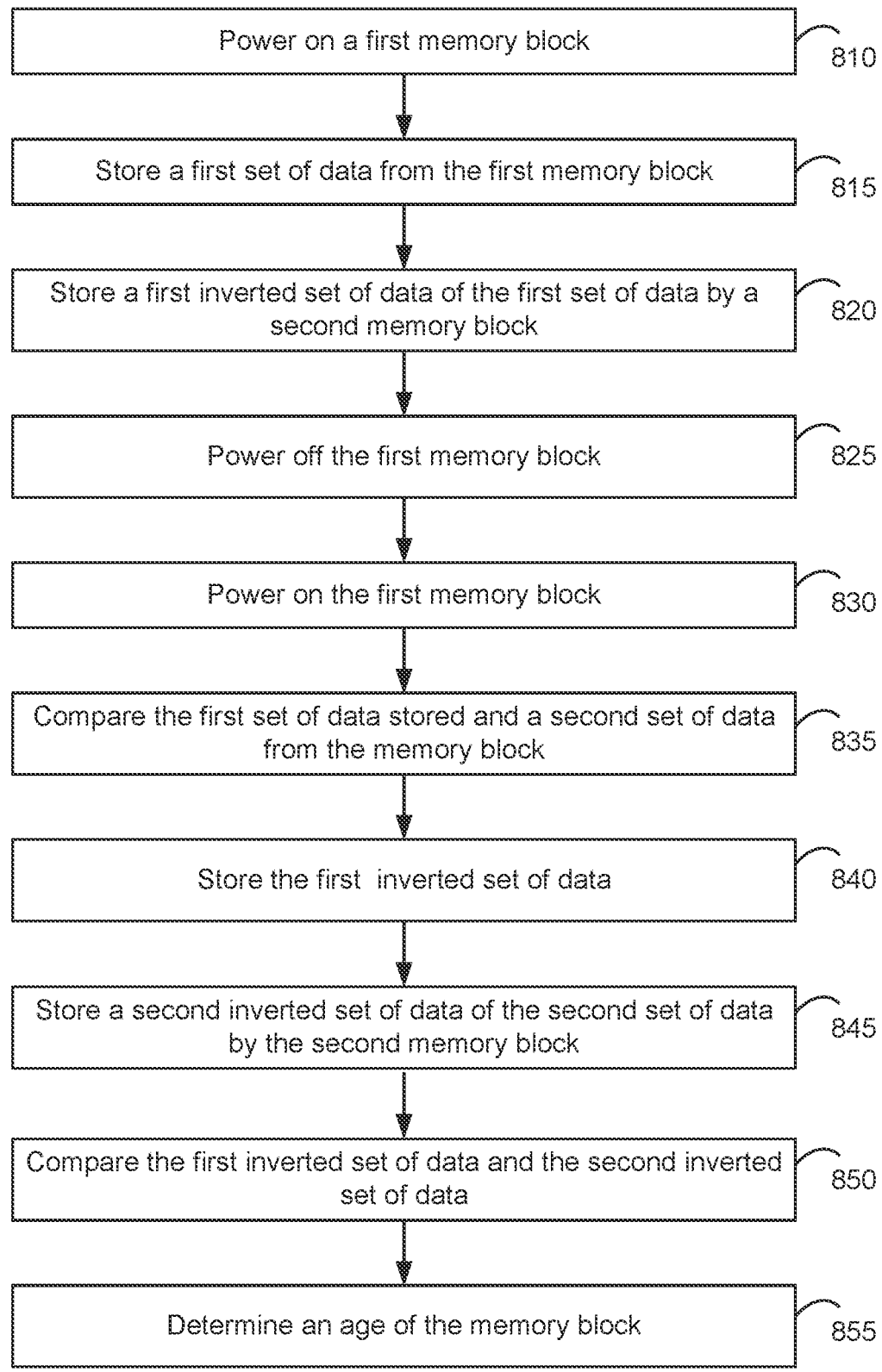
FIG. 8 is a flowchart of a method of determining an age of a memory block, in accordance with some embodiments.

FIG. 8 is a flowchart of a method of 800 determining an age of a memory block 110X, in accordance with some embodiments. The method 800 may be performed by one or more components of the memory age detector 120B of FIG. 8. In some embodiments, the method 800 is performed by other entities. In one aspect, the method 800 is performed periodically (e.g., every 1000 power on) or in response to a request from another device. In some embodiments, the method 800 includes more, fewer, or different operations than shown in FIG. 8.

In an operation 810, the controller 660 causes a first memory block 110X to power on at a first time. When the first memory block 110X is powering on, no input data may be provided to the memory block 110X. When powering on, the first memory block 110X may generate a first set of data (e.g., N-bit data 305). In an operation 815, after powering on the first memory block 110X, the first memory block 110X may provide the first set of data (e.g., N-bit data 305) to the temporary storage block 310, and the temporary storage block 310 may store the received first set of data (e.g., N-bit data 305). In an operation 820, the controller 660 may cause or configure a second memory block 110Y to store a first inverted set of data having inverted states of the first set of data (e.g., N-bit data 305). In an operation 825, after storing the first set of data (e.g., N-bit data 305) by the temporary storage block 310 and the first inverted set of data by the second memory block 110Y, the controller 660 may cause the memory block 110X to power off or reset.

In an operation 830, after powering off the memory block 110X, the controller 660 causes the memory block 110X to power on at a second time after the first time. When the memory block 110X is powering on, no input data may be provided to the memory block 110X. When powering on, the memory block 110X may generate a second set of data (e.g., updated N-bit data 305). In an operation 835, the inconsistency detector 650 compares the first set of data (e.g., N-bit data 315 stored by the temporary storage block 310) with the second set of data (e.g., updated N-bit data 305) generated by the memory block 110X, and determines a first number of inconsistent bits of the first set of data (e.g., N-bit data 315 stored by the temporary storage block 310) based on the comparison. In one approach, the inconsistency detector 650 compares each bit of the first set of data (e.g., N-bit data 315 stored by the temporary storage block 310) with a corresponding bit of the second set of data (e.g., updated N-bit data 315), and determines the first number of different bits or inconsistent bits according to the comparison.

In an operation 840, after determining the first number of different bits, the second memory block 110Y may provide the first inverted set of data (e.g., inverted N-bit data 328) to the temporary storage block 310, and the temporary storage block 310 may store the received first inverted set of data (e.g., inverted N-bit data 628). In an operation 845, the second memory block 110Y may store a second inverted set of data having inverted states of the second set of data (e.g., N-bit data 305). In an operation 850, after storing the second inverted set of data by the second memory block 110Y, the inconsistency detector 650 compares the first inverted set of data (e.g., N-bit data 315 stored by the temporary storage block 310) stored by the temporary storage block 310 with the second inverted set of data (e.g., inverted N-bit data 628) stored by the memory block 110Y, and determines a second number of inconsistent bits of the first inverted set of data (e.g., N-bit data 315 stored by the temporary storage block 310) based on the comparison. In one approach, the inconsistency detector 650 compares each bit of the first inverted set of data (e.g., N-bit data 315 stored by the temporary storage block 310) with a corresponding bit of the second inverted set of data (e.g., updated inverted N-bit data 628), and determines the second number of different bits or inconsistent bits according to the comparison.

In an operation 855, the controller 660 determines an age of the memory block 110X according to the first number of different bits and the second number of different bits. In one approach, the controller 660 determines a third number by obtaining a difference between the first number and the second number, and compares the third number against a predetermined threshold number corresponding to a predetermined age or a predetermined usage (e.g., over one million power on sequences) of the memory block 110X. In response to determining that the third number is larger than the predetermined threshold number, the controller 660 may determine that the memory block 110X has aged or has been used over a predetermined number. In response to determining that the third number is less than the predetermined threshold number, the controller 660 may determine that the memory block 110X has not aged or has not been used over the predetermined number. Advantageously, by detecting determining a difference between i) a first number of inconsistent bits or different bits in the N-bit data 305, and ii) a second number of inconsistent bits or different bits in the inverted N-bit data 628, memory cells of the memory block 110X that produced consistent or stable bits despite aging can be detected as well.

Figure 9:
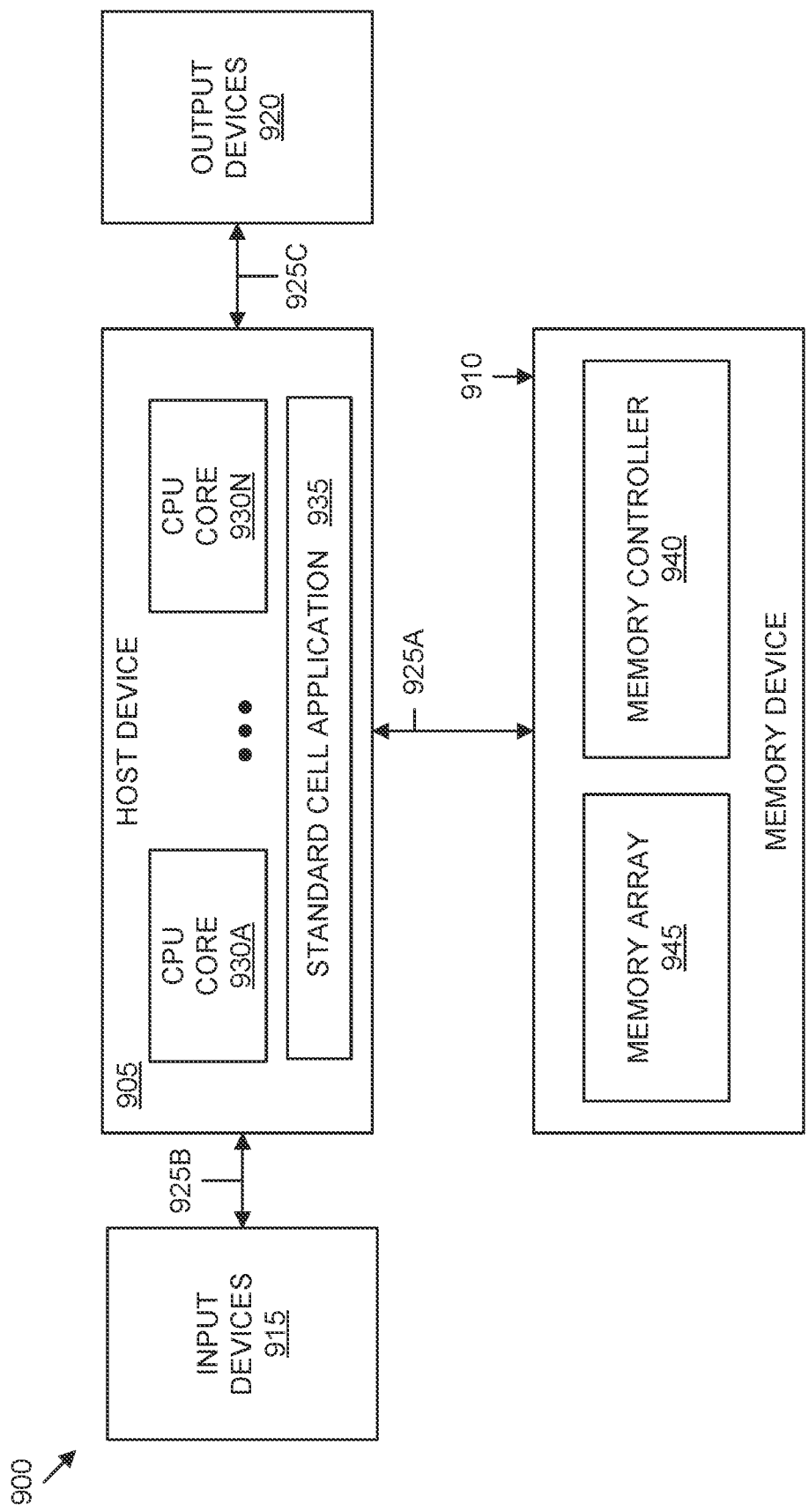
FIG. 9 is an example block diagram of a computing system, in accordance with some embodiments.

Referring now to FIG. 9, an example block diagram of a computing system 900 is shown, in accordance with some embodiments of the disclosure. The computing system 900 may be used by a circuit or layout designer for integrated circuit design. A "circuit" as used herein is an interconnection of electrical components such as resistors, transistors, switches, batteries, inductors, or other types of semiconductor devices configured for implementing a desired functionality. The computing system 900 includes a host device 905 associated with a memory device 910. The host device 905 may be configured to receive input from one or more input devices 915 and provide output to one or more output devices 920. The host device 905 may be configured to communicate with the memory device 910, the input devices 915, and the output devices 920 via appropriate interfaces 925A, 925B, and 925C, respectively. The computing system 900 may be implemented in a variety of computing devices such as computers (e.g., desktop, laptop, servers, data centers, etc.), tablets, personal digital assistants, mobile devices, other handheld or portable devices, or any other computing unit suitable for performing schematic design and/or layout design using the host device 905.

The input devices 915 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 905 and that allows an external source, such as a user (e.g., a circuit or layout designer), to enter information (e.g., data) into the host device and send instructions to the host device. Similarly, the output devices 920 may include a variety of output technologies such as external memories, printers, speakers, displays, microphones, light emitting diodes, headphones, video devices, and any other output peripherals that are configured to receive information (e.g., data) from the host device 905. The "data" that is either input into the host device 905 and/or output from the host device may include any of a variety of textual data, circuit data, signal data, semiconductor device data, graphical data, combinations thereof, or other types of analog and/or digital data that is suitable for processing using the computing system 900.

The host device 905 includes or is associated with one or more processing units/processors, such as Central Processing Unit ("CPU") cores 930A-930N. The CPU cores 930A-930N may be implemented as an Application Specific Integrated Circuit ("ASIC"), Field Programmable Gate Array ("FPGA"), or any other type of processing unit. Each of the CPU cores 930A-930N may be configured to execute instructions for running one or more applications of the host device 905. In some embodiments, the instructions and data to run the one or more applications may be stored within the memory device 910. The host device 905 may also be configured to store the results of running the one or more applications within the memory device 910. Thus, the host device 905 may be configured to request the memory device 910 to perform a variety of operations. For example, the host device 905 may request the memory device 910 to read data, write data, update or delete data, and/or perform management or other operations. One such application that the host device 905 may be configured to run may be a standard cell application 935. The standard cell application 935 may be part of a computer aided design or electronic design automation software suite that may be used by a user of the host device 905 to use, create, or modify a standard cell of a circuit. In some embodiments, the instructions to execute or run the standard cell application 935 may be stored within the memory device 910. The standard cell application 935 may be executed by one or more of the CPU cores 930A-930N using the instructions associated with the standard cell application from the memory device 910. In one example, the standard cell application 935 allows a user to utilize pre-generated schematic and/or layout designs of the memory system 100 or a portion of the memory system 100 to aid integrated circuit design. After the layout design of the integrated circuit is complete, multiples of the integrated circuit, for example, including the memory system 100 or a portion of the memory system 100 can be fabricated according to the layout design by a fabrication facility.

Referring still to FIG. 9, the memory device 910 includes a memory controller 940 that is configured to read data from or write data to a memory array 945. The memory array 945 may include a variety of volatile and/or non-volatile memories. For example, in some embodiments, the memory array 945 may include NAND flash memory cores. In other embodiments, the memory array 945 may include NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. The memories within the memory array 945 may be individually and independently controlled by the memory controller 940. In other words, the memory controller 940 may be configured to communicate with each memory within the memory array 945 individually and independently. By communicating with the memory array 945, the memory controller 940 may be configured to read data from or write data to the memory array in response to instructions received from the host device 905. Although shown as being part of the memory device 910, in some embodiments, the memory controller 940 may be part of the host device 905 or part of another component of the computing system 900 and associated with the memory device. The memory controller 940 may be implemented as a logic circuit in either software, hardware, firmware, or combination thereof to perform the functions described herein. For example, in some embodiments, the memory controller 940 may be configured to retrieve the instructions associated with the standard cell application 935 stored in the memory array 945 of the memory device 910 upon receiving a request from the host device 905.

It is to be understood that only some components of the computing system 900 are shown and described in FIG. 9. However, the computing system 900 may include other components such as various batteries and power sources, networking interfaces, routers, switches, external memory systems, controllers, etc. Generally speaking, the computing system 900 may include any of a variety of hardware, software, and/or firmware components that are needed or considered desirable in performing the functions described herein. Similarly, the host device 905, the input devices 915, the output devices 920, and the memory device 910 including the memory controller 940 and the memory array 945 may include other hardware, software, and/or firmware components that are considered necessary or desirable in performing the functions described herein.

One aspect of this description relates to a system. In some embodiments, the system includes a memory block to generate a first set of data in response to a first power on and generate a second set of data in response to a second power on. In some embodiments, the system includes an age detector coupled to the memory block. In some embodiments, the age detector includes a storage block coupled to the memory block. The age detector may be configured to store the first set of data from the memory block. In some embodiments, the age detector includes an inconsistency detector coupled to the memory block and the storage block. The inconsistency detector may be configured to compare the first set of data and the second set of data. In some embodiments, the age detector includes a controller coupled to the inconsistency detector. The controller may be configured to determine an age of the memory block, based on the comparison.

One aspect of this description relates to a method of determining an age of a memory block. In some embodiments, the method includes causing, by a controller, at a first time, the memory block to power on. In one aspect, the memory block generates a first set of data in response to power on at the first time. In some embodiments, the method includes causing, by the controller, a storage block to store the first set of data. In some embodiments, the method includes causing, by the controller, the memory block to power off the memory block after the storage block storing the first set of data. In some embodiments, the method includes causing, by the controller, at a second time after the first time, the memory block to power on, after powering off the memory block. In one aspect, the memory block generates a second set of data in response to power on at a second time. In some embodiments, the method includes comparing, by an inconsistency detector, the first set of data and the second set of data. In some embodiments, the method includes determining, by the controller, an age of the memory block based on the comparison.

One aspect of this description relates to a system. In some embodiments, the system includes a first memory block to generate a first set of data in response to a first power on and generate a second set of data in response to a second power on. In some embodiments, the system includes a second memory block to store a first inverted set of data having inverted states of the first set of data and store a second inverted set of data having inverted states of the second set of data. In some embodiments, the system includes an age detector coupled to the first memory block and the second memory block. The age detector may be configured to determine an age of the first memory block, based on the first set of data, the second set of data, the first inverted set of data, and the second inverted set of data. In some embodiments, the age detector is to determine a first number of different bits between the first set of data and the second set of data, determine a second number of different bits between the first inverted set of data and the second inverted set of data, and determine the age of the first memory block according to the first number and the second number. In some embodiments, the age detector is to determine the age of the first memory block according to the first number and the second number by determining a third number of different bits between the first number and the second number, comparing the third number with a predetermined threshold number, and determining the age of the first memory block according to the comparison.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   obtaining, by a memory device, first data and second data from a memory block at respective power on instances of the memory block,
   comparing, by the memory device, the first data and the second data from the memory block, and
   determining, by the memory device, a consistency or an inconsistency between the first data and the second data of the memory block based on the comparison.

2. The method of claim 1, comprising:
   based on the consistency or the inconsistency between the first data and the second data, determining, by the memory device, an age of the memory block.

3. The method of claim 1, wherein determining the consistency or the inconsistency comprises:
   determining, by the memory device, a number of different bits between the first data and the second data, and
   determining, by the memory device, an age of the memory block, according to the determined number of different bits.

4. The method of claim 3, comprising:
   comparing, by the memory device, the determined number of different bits and a threshold number corresponding to a predetermined usage of the memory block, and
   determining, by the memory device, that the memory block is aged over the predetermined usage, in response to the determined number of different bits being higher than the threshold number.

5. The method of claim 3, comprising:
   comparing, by the memory device, the determined number of different bits and a threshold number corresponding to a predetermined usage of the memory block, and
   determining, by the memory device, that the memory block is aged less than the predetermined usage, in response to the determined number of different bits being less than the threshold number.

6. The method of claim 1, comprising:
   obtaining, by the memory device, first inverted data and second inverted data by inverting the first data and the second data, respectively, and
   storing, by the memory device, the first inverted data and the second inverted data.

7. The method of claim 6, wherein determining the consistency or the inconsistency comprising:
   determining, by the memory device, a first number of different bits between the first data and the second data,
   determining, by the memory device, a second number of different bits between the first inverted data and the second inverted data, and
   determining, by the memory device, an age of the memory block, according to the first number and the second number.

8. The method of claim 7, comprising:
   determining, by the memory device, a third number of difference between the first number and the second number,
   comparing, by the memory device, the third number and a threshold number corresponding to a predetermined usage of the memory block, and
   determining, by the memory device, that the memory block is aged over the predetermined usage, based on the third number being higher than the threshold number.

9. The method of claim 7, comprising:
   determining, by the memory device, a third number of difference between the first number and the second number,
   comparing, by the memory device, the third number and a threshold number corresponding to a predetermined usage of the memory block, and
   determine that the memory block is aged less than the predetermined usage, based on the third number being less than the threshold number.

10. The method of claim 1, wherein the memory block includes static random access memory cells.

11. A memory device to:
    obtain first data and second data from a memory block at respective power on instances of the memory block,
    compare the first data and the second data from the memory block, and
    determine a consistency or an inconsistency between the first data and the second data of the memory block based on the comparison.

12. The memory device of claim 11, is to:
    based on the consistency or the inconsistency between the first data and the second data, determine an age of the memory block.

13. The memory device of claim 11, wherein to determine the consistency or the inconsistency, the memory device is to:
   determine a number of different bits between the first data and the second data, and
   determine an age of the memory block, according to the determined number of different bits.

14. The memory device of claim 13, is to:
   compare the determined number of different bits and a threshold number corresponding to a predetermined usage of the memory block, and
   determine that the memory block is aged over the predetermined usage, in response to the determined number of different bits being higher than the threshold number.

15. The memory device of claim 13, comprising:
   compare the determined number of different bits and a threshold number corresponding to a predetermined usage of the memory block, and
   determine that the memory block is aged less than the predetermined usage, in response to the determined number of different bits being less than the threshold number.

16. A system comprising:
   a memory block;
   a controller to:
      obtain first data and second data from the memory block at respective power on instances of the memory block; and
   an inconsistency detector to compare the first data and the second data from the memory block,
   wherein the controller is to determine a consistency or an inconsistency between the first data and the second data of the memory block based on the comparison.

17. The system of claim 16, further comprising:
   an inverter to obtain first inverted data and second inverted data by inverting the first data and the second data, respectively; and
   another memory block,
   wherein the controller is to:
      cause a storage block to store the first inverted data and the second inverted data.

18. The system of claim 17,
   wherein the inconsistency detector is to:
      determine a first number of different bits between the first data and the second data, and
      determine a second number of different bits between the first inverted data and the second inverted data, and
   wherein the controller is to determine an age of the memory block, according to the first number and the second number.

19. The system of claim 18,
   wherein the inconsistency detector is to determine a third number of difference between the first number and the second number, and
   wherein the controller is to determine the age of the memory block, according to the first number and the second number by:
      comparing the third number and a threshold number corresponding to a predetermined usage of the memory block, and
      determining that the memory block is aged over the predetermined usage, based on the third number being higher than the threshold number.

20. The system of claim 18,
   wherein the inconsistency detector is to determine a third number of difference between the first number and the second number, and
   wherein the controller is to determine the age of the memory block, according to the first number and the second number by:
      comparing the third number and a threshold number corresponding to a predetermined usage of the memory block, and
   determining that the memory block is aged less than the predetermined usage, based on the third number being less than the threshold number.

* * * * *